(12) United States Patent
Nozawa

(10) Patent No.: US 10,630,179 B2
(45) Date of Patent: Apr. 21, 2020

(54) VOLTAGE CONVERTER

(71) Applicant: TOYOTA JIDOSHA KABUSHIKI KAISHA, Toyota-shi, Aichi-ken (JP)

(72) Inventor: Takashi Nozawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/418,436

(22) Filed: May 21, 2019

(65) Prior Publication Data

US 2019/0386564 A1 Dec. 19, 2019

(30) Foreign Application Priority Data

Jun. 14, 2018 (JP) ................................ 2018-113304

(51) Int. Cl.
*H02M 3/156* (2006.01)
*G05F 1/571* (2006.01)
*H02M 1/00* (2006.01)

(52) U.S. Cl.
CPC ............ *H02M 3/156* (2013.01); *G05F 1/571* (2013.01); *H02M 2001/0025* (2013.01)

(58) Field of Classification Search
CPC .......... H02M 3/156; H02M 2001/0025; G05F 1/571
See application file for complete search history.

(56) References Cited

U.S. PATENT DOCUMENTS

| | | | | |
|---|---|---|---|---|
| 7,042,200 B2* | 5/2006 | Chen | ..................... | H02M 3/156 |
| | | | | 323/283 |
| 9,075,423 B2* | 7/2015 | Zhu | ......................... | G05F 1/575 |
| 9,455,626 B2* | 9/2016 | Xue | ....................... | H02M 3/156 |
| 9,641,070 B2* | 5/2017 | Wibben | ............... | G01R 31/2853 |
| 9,654,006 B2* | 5/2017 | Tajima | ................ | H02M 3/1582 |
| 9,787,185 B2* | 10/2017 | Lo Iacono | ............ | H02M 3/156 |
| 10,033,265 B2* | 7/2018 | Sugawara | ........... | H02M 1/4225 |
| 10,097,094 B2* | 10/2018 | Chen | ....................... | H02M 1/00 |
| 2002/0125872 A1 | 9/2002 | Groom et al. | | |
| 2015/0015224 A1 | 1/2015 | Yasusaka | | |

FOREIGN PATENT DOCUMENTS

JP 2005-168129 A 6/2005

\* cited by examiner

*Primary Examiner* — Kyle J Moody
(74) *Attorney, Agent, or Firm* — Oliff PLC

(57) ABSTRACT

A voltage converter may include a first voltage sensor and a second voltage sensor both configured to measure an output voltage of a voltage converter circuit and a controller configured to execute a feedback control for the voltage converter circuit such that a voltage difference between a target voltage and a measured value of the first voltage sensor becomes zero and configured to execute a predetermined error process in a case where a measured value of the second voltage sensor exceeds a predetermined voltage upper limit value. The controller may execute the feedback control such that a voltage difference between a correction target voltage and the measured value of the first voltage sensor becomes zero while the measured value of the second voltage sensor exceeds a voltage threshold which is less than the voltage upper limit value.

4 Claims, 3 Drawing Sheets

VOLTAGE CONVERTER

CROSS-REFERENCE TO RELATED APPLICATION

This application claims priority to Japanese Patent Application No. 2018-113304 filed on Jun. 14, 2018, the contents of which are hereby incorporated by reference into the present application.

TECHNICAL FIELD

The technique disclosed herein relates to a voltage converter, and more particularly relates to a voltage converter configured to execute an error process when an output voltage exceeds a voltage upper limit value.

BACKGROUND

A voltage converter is subjected to a feedback control such that its output voltage becomes coincident with a predetermined target voltage. For example, Japanese Patent Application Publication No. 2005-168129 describes a voltage converter including a voltage sensor that measures its output voltage. A controller of the voltage converter executes a feedback control such that a voltage difference between a target voltage and a measured output voltage becomes zero. For the convenience of description, a circuit that performs voltage conversion (a voltage converter circuit) may be referred to as a main circuit below. That is, the voltage converter includes the main circuit that performs voltage conversion and the controller that controls the main circuit.

SUMMARY

A voltage converter may be configured to execute an error process when its output voltage exceeds a predetermined voltage upper limit value as a measure against failure, separately from a feedback control. A typical error process is a process of stopping a main circuit. In order to increase reliability, the voltage converter may include two voltage sensors for measuring the output voltage. One of the voltage sensors (a first voltage sensor) is used for the feedback control, and the other (a second voltage sensor) is used for monitoring an overvoltage.

Meanwhile, measured values of the voltage sensors may have measurement errors. If measurement errors of the respective two voltage sensors are accumulated, the following disadvantage may be caused. For the convenience of description, a measured value of the first voltage sensor will be denoted by "Vs1", and a measured value of the second voltage sensor will be denoted by "Vs2". A true value of the output voltage will be denoted by "Vout". An error of the first voltage sensor will be denoted by "e1", and an error of the second voltage sensor will be denoted by "e2". A target voltage of the feedback control will be denoted by "VLO". A voltage upper limit value for overvoltage prevention will be denoted by "Vx". A tolerance of the first voltage sensor will be denoted by "|e1|", and a tolerance of the second voltage sensor will be denoted by "|e2|".

A controller of the voltage converter controls a main circuit such that a difference between the output voltage Vout and the target voltage VLO becomes zero. The controller uses the measured value Vs1 of the first voltage sensor for the feedback control. The measured value Vs1 of the first voltage sensor may have the error e1. A maximum value of the error e1 of the first voltage sensor is the tolerance |e1|. When the error e1 takes the maximum value, the measured value Vs1 of the first voltage sensor can be indicated by "Vout−|e1|". Since the controller executes the feedback control such that "VLO−Vs1" becomes zero, the actual output voltage Vout is indicated by "VLO+|e1|" when the measured value Vs1 is Vout−|e1|.

The measured value Vs2 of the second voltage sensor may also have the error e2. A maximum value of the error e2 is the tolerance |e2|. Therefore, with Vout=VOL+|e1|, the measured value Vs2 of the second voltage sensor can be indicated by Vs2=Vout+|e2|=VLO+|e1|+|e2| when the error takes the maximum value. In a case where the target voltage VLO and the voltage upper limit value Vx are close to each other, the measured value Vs2 (=VLO+|e1|+|e2|) of the second voltage sensor may exceed the voltage upper limit value Vx, despite the fact that the actual output voltage Vout is not exceeding the voltage upper limit value Vx. In this case, the controller that is monitoring the measured value Vs2 of the second sensor determines that the output voltage exceeds the voltage upper limit value Vx and executes the error process.

It should be avoided that the error process is executed due to accumulation of the errors of the two voltage sensors (the tolerances |e1| and |e2|) when the actual output voltage Vout does not exceed the voltage upper limit value Vx. The disclosure herein relates to a voltage converter including two voltage sensors respectively for a feedback control and for overvoltage monitoring, and provides a technique for avoiding a disadvantage caused by accumulation of errors of the two voltage sensors.

A voltage converter disclosed herein may comprise a voltage converter circuit; a first voltage sensor and a second voltage sensor both configured to measure an output voltage of the voltage converter circuit; and a controller configured to execute a feedback control for the voltage converter circuit such that a voltage difference between a target voltage and a measured value of the first voltage sensor becomes zero and configured to execute a predetermined error process in a case where a measured value of the second voltage sensor exceeds a predetermined voltage upper limit value, wherein the controller executes the feedback control for the voltage converter circuit such that a voltage difference between a correction target voltage and the measured value of the first voltage sensor becomes zero while the measured value of the second voltage sensor exceeds a voltage threshold which is less than the voltage upper limit value, the correction target voltage obtained by subtracting an offset voltage from the target voltage.

DETAILED DESCRIPTION

Figure 1:
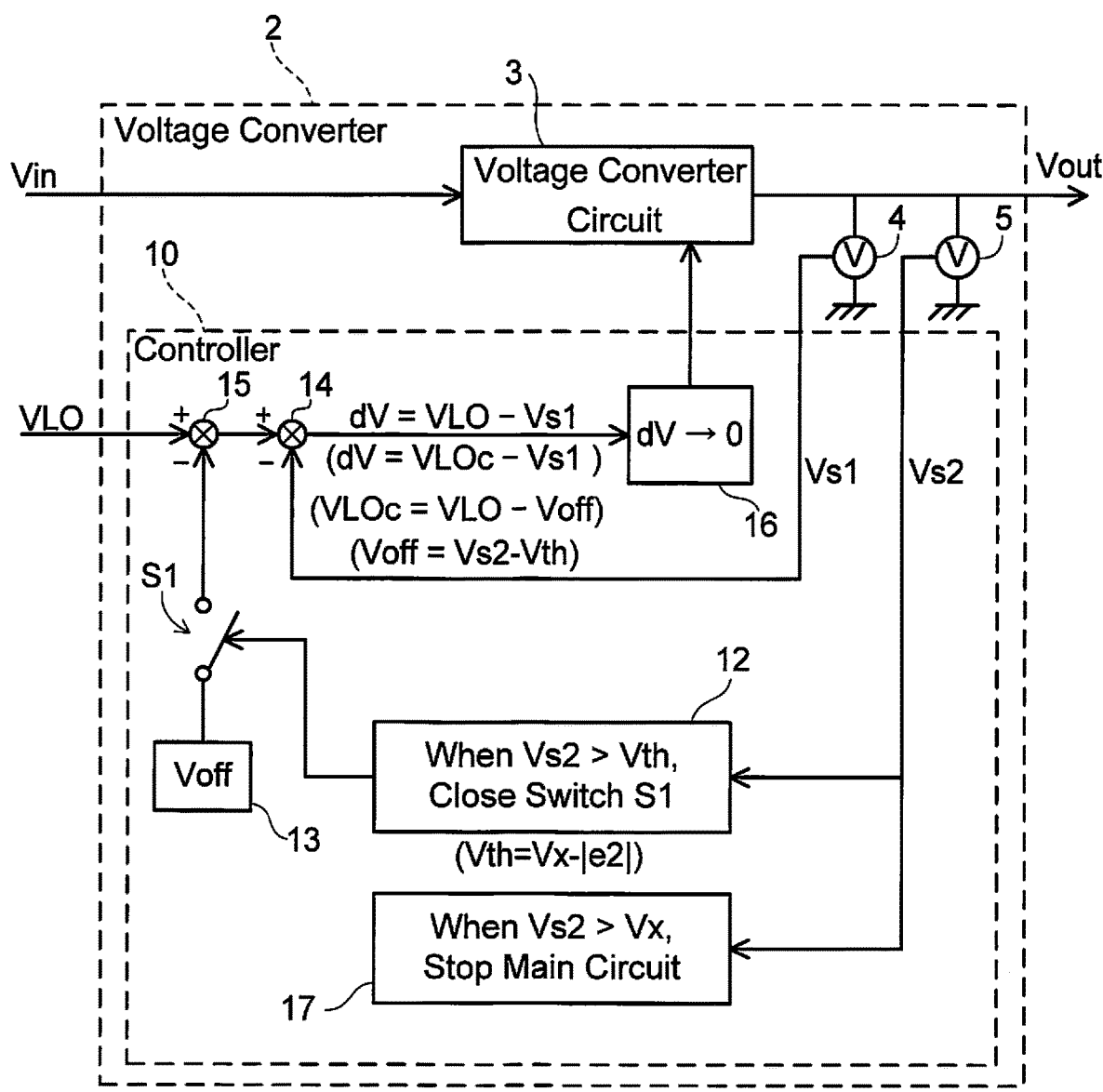
FIG. 1 is a control block diagram of a voltage converter of a first embodiment.

One aspect of a voltage converter may comprise a voltage converter circuit (a main circuit), a first voltage sensor and a second voltage sensor both configured to measure an output voltage of the voltage converter circuit, and a controller. The controller may be configured to execute a feedback control for the voltage converter circuit such that a voltage difference between a target voltage VLO and a measured value Vs1 of the first voltage sensor becomes zero. The target voltage VLO is typically given from a high-order controller. The controller may be also configured to execute a predetermined error process in a case where a measured value Vs2 of the second voltage sensor exceeds a predetermined voltage upper limit value Vx. While the measured value Vs2 of the second voltage sensor exceeds a voltage threshold Vth which is less than the voltage upper limit value Vx, the controller corrects the target voltage VLO to a value less than the target voltage VLO. In other words, while the measured value Vs2 of the second voltage sensor exceeds the voltage threshold Vth which is less than the voltage upper limit value Vx, the controller may execute the feedback control for the voltage converter circuit such that a voltage difference between a correction target voltage VLOc, which is obtained by subtracting a predetermined offset voltage Voff from the target voltage, and the measured value Vs1 of the first voltage sensor becomes zero. The sign "Vth" denotes the voltage threshold.

The technique disclosed herein corrects the target voltage VLO to the correction target voltage VLOc (=VLO−Voff) when the measured value Vs2 of the second voltage sensor has come close to the voltage upper limit value Vx. Lowering the target voltage VLO may make the actual output voltage Vout less than the original target voltage VLO, however, it can prevent the measured value Vs2 of the second voltage sensor from exceeding the voltage upper limit value Vx because of accumulation of errors. Since the target voltage is not corrected when the measured value Vs2 of the second voltage sensor is less than the voltage threshold Vth, the output voltage Vout is controlled to be coincident with the target voltage VLO.

Typically, the offset voltage Voff may be set to a value obtained by subtracting the voltage threshold Vth from the measured value Vs2 of the second voltage sensor. That is, the controller may be configured to change the target voltage VLO to VLOc (=Vs2−Vth) when the measured value Vs2 of the second voltage sensor exceeds the voltage threshold Vth. In this configuration, when the voltage difference becomes zero by the feedback control using the first voltage sensor, the actual output voltage Vout does not exceed the voltage upper limit value Vx.

Typically, the voltage threshold Vth may be set to a value obtained by subtracting the measurement tolerance |e2| of the second voltage sensor from the voltage upper limit value Vx. In this case, even if the measured value Vs2 of the second voltage sensor is greater than the actual output voltage by the tolerance |e2|, the measured value Vs2 of the second voltage sensor satisfies Vs2=Vx−|e2|−e2 (derivation of this equation will be described in an embodiment). That is, the measured value Vs2 of the second voltage sensor is suppressed to a value less than the voltage upper limit value Vx. Since lowering the target voltage VLO lowers the measured value Vs2 of the second voltage sensor, the measured value Vs2 of the second voltage sensor is prevented from exceeding the voltage upper limit value Vx. That is, execution of the error process due to accumulation of the errors of the two voltage sensors is prevented.

As described before, the error process may typically be a process of stopping the voltage converter circuit. Alternatively, the error process may be a process of limiting an upper limit of an output of the voltage converter circuit.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved voltage converters.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

First Embodiment

A voltage converter 2 of a first embodiment will be described referring to the drawings. FIG. 1 is a control block diagram of the voltage converter 2 of the first embodiment. The voltage converter 2 is a device that transforms an input voltage Vin to a target voltage VLO. The target voltage VLO is given from a high-order controller (not illustrated).

The voltage converter 2 includes a voltage converter circuit 3, a controller 10, and two voltage sensors (a first voltage sensor 4 and a second voltage sensor 5). The voltage converter circuit 3 is a main circuit that converts a voltage. The voltage converter circuit 3 is a non-isolated converter constituted of a switching element and a reactor, and is configured to adjust a ratio of the input voltage Vin and an output voltage Vout by controlling the switching element. In the following description, the voltage converter circuit 3 is referred to as the main circuit 3 for convenience of description.

The controller 10 is constituted of a plurality of blocks. The controller 10 includes a feedback control block 16, a target voltage correction block 12, and an overvoltage monitoring block 17. The controller 10 further includes subtractors 14 and 15, an offset output block 13, and a switch S1. The blocks other than the overvoltage monitoring block 17 are achieved by a CPU (central processing unit) and a program (software). The overvoltage monitoring block 17 is required to surely operate even in an emergency situation, for example, in a collision, and is therefore achieved by hardware, not by software.

The feedback control block 16 controls the main circuit 3 such that the output voltage Vout follows the target voltage VLO. The feedback control block 16 controls the main circuit 3 such that a voltage difference dV (=VLO−Vs1) between a measured value Vs1 of the first voltage sensor 4 and the target voltage VLO converges to zero. To "control the main circuit 3" means to drive the switching element included in the main circuit 3 with a predetermined duty cycle. The feedback control block 16 increases the duty cycle when the measured value Vs1 is less than the target voltage VLO and reduces the duty cycle when the measured value Vs1 is greater than the target voltage VLO. Specifically, a PID control algorithm is incorporated in the feedback control block 16 to make the voltage difference dV between the target voltage VLO and the measured value Vs1 of the first voltage sensor 4 converge to zero.

The voltage difference dV between the target voltage VLO and the measured value Vs1 of the first voltage sensor 4 is obtained by the subtractor 14. The result from the subtractor 14 is inputted to the feedback control block 16.

As described before, the target voltage VLO is given from the high-order controller (not illustrated). When a specific condition is satisfied, the controller 10 corrects the target voltage VLO to a correction target voltage VLOc (=VLO−Voff). In a case where the target voltage VLO is corrected, the feedback control block 16 controls the main circuit 3 such that the measured value Vs1 of the first voltage sensor 4 follows the correction target voltage VLOc. That is, the feedback control block 16 controls the main circuit 3 such that the voltage difference dV (=VLOc−Vs1) converges to zero.

The specific condition is that a measured value Vs2 of the second voltage sensor 5 exceeds a predetermined voltage threshold Vth. Whether the specific condition is satisfied or not is determined by the target voltage correction block 12. The measured value Vs2 of the second voltage sensor 5 is inputted to the target voltage correction block 12. When the measured value Vs2 of the second voltage sensor 5 exceeds the voltage threshold Vth, the target voltage correction block 12 closes the switch S1 to connect the offset output block 13 to the subtractor 15. The offset output block 13 generates an offset voltage Voff. When the offset output block 13 is connected to the subtractor 15, the offset voltage Voff is subtracted from the target voltage VLO sent from the high-order controller in the subtractor 15. That is, the target voltage VLO is corrected to the correction target voltage VLOc (=VLO−Voff).

The measured value Vs2 of the second voltage sensor 5 is also inputted to the overvoltage monitoring block 17. When the measured value Vs2 exceeds a voltage upper limit value Vx, the overvoltage monitoring block 17 stops the main circuit 3.

The offset voltage Voff is set to a value obtained by subtracting the voltage threshold Vth from the measured value Vs2 of the second voltage sensor 5. Since the offset voltage Voff (=Vs2−Vth) is used when the measured value Vs2 exceeds the voltage threshold Vth, it is set to a small positive value.

Further, the voltage threshold Vth is set to a value obtained by subtracting a measurement tolerance |e2| of the second voltage sensor 5 from the voltage upper limit value Vx. The tolerance |e2| means a possible maximum value of a measurement error of the second voltage sensor 5. Although the error can be a positive error or a negative error, the tolerance is expressed as an absolute value thereof. A tolerance |e1| of the first voltage sensor 4, which will be described later, means a possible maximum value (absolute value) of a measurement error of the first voltage sensor 4.

Advantageous effects brought by the process of correcting the target voltage VLO when the measured value Vs2 of the second voltage sensor 5 exceeds the voltage threshold Vth will be described. The measured value Vs2 of the second voltage sensor 5 may have the error of which magnitude is the tolerance |e2| at the maximum. The measured value Vs1 of the first voltage sensor 4 may also have the error of which magnitude is the tolerance of |e1| at the maximum. The feedback control block 16 controls the main circuit 3 such that the output voltage Vout becomes coincident with the target voltage VLO. However, the feedback control block 16 knows the output voltage Vout by using the first voltage sensor 4, of which measured value Vs1 has the error. In a case where the measured value Vs1 has the error having the magnitude of the tolerance |e1|, when the measured value Vs1 is controlled to become coincident with the target voltage VLO, the actual output voltage Vout becomes VLO+|e1| (Vout=VLO+|e1|) with the maximum error.

The second voltage sensor 5 also measures the output voltage Vout. In a case where the measured value Vs2 of the second voltage sensor 5 has the error of the tolerance |e2|, the measured value Vs2 can indicate Vout+e2 at the maximum. As described before, the actual output voltage Vout can indicate VLO+|e1| by the feedback control using the first voltage sensor 4. Therefore, if the error of the first voltage sensor 4 is accumulated, the measured value Vs2 of the second voltage sensor 5 can indicate Vs2=VLO+|e1|+|e2|.

Meanwhile, the overvoltage monitoring block 17 stops the main circuit 3 when the measured value Vs2 exceeds the voltage upper limit value Vx. In a case where the voltage (VLO+|e1|+|e2|) exceeds the voltage upper limit value Vx, the overvoltage monitoring block 17 may determine that the output voltage Vout exceeds the voltage upper limit value Vx due to the accumulation of the errors, despite the actual output voltage Vout being VLO+|e1| (<the voltage upper limit value Vx). As a result, the error process is executed despite the actual output voltage Vout being VLO+|e1| (<the voltage upper limit value Vx).

The actual output voltage Vout, which is the result of the feedback control, is lowered by changing the target voltage VLO to the correction target voltage VLOc (=VLO−(Vs2−Vth)) when the measured value Vs2 of the second voltage sensor 5 exceeds the voltage threshold Vth (=Vx−|e2|). Specifically, the output voltage Vout is expressed by Equation 1.

$$\begin{aligned}
Vout &= VLOc + e1 & \text{(Equation 1)} \\
&= (VLO - (Vs2 - Vth)) + e1 \\
&= (VLO - ((Vs1 + e2)Vth)) + e1 \\
&= (VLO - (((VLO + e1) + e2) - Vth) + e1 \\
&= VLO - VLO - e1 - e2 + Vth + e1 \\
&= Vth - e2 \\
&= (Vx - |e2|) - e2
\end{aligned}$$

In this case, the measured value Vs2 of the second voltage sensor 5 is expressed by Equation 2.

$$\begin{aligned}
Vs2 &= Vout + e2 & \text{(Equation 2)} \\
&= (Vx - |e2|) - e2 + e2 \\
&= Vx - |e2|
\end{aligned}$$

Accordingly, by correcting the target voltage VLO as described above when the measured value Vs2 of the second voltage sensor 5 exceeds the voltage threshold Vth (=Vx−

|e2|), the measured value of the second voltage sensor 5 does not exceed the voltage upper limit value Vx.

A process executed by the controller 10 will be described again, referring to a flowchart in FIG. 2. The flowchart in FIG. 2 includes a process of correcting the target voltage VLO and a process of monitoring overvoltage, but does not include the feedback control. The feedback control is regularly executed separately from the process in FIG. 2. The controller 10 regularly executes the process in FIG. 2 during an operation of the main circuit 3.

The controller 10 acquires the measured value Vs2 of the second voltage sensor 5 (Step S2). The controller 10 then compares the measured value Vs2 and the voltage threshold Vth with each other (Step S3). In a case where the measured value Vs2 does not exceed the voltage threshold Vth, the controller 10 opens the switch S1 (NO in Step S3, and Step S5). In a case where the switch S1 has been already opened before execution of Step S5, the controller 10 may do nothing.

In a case where the measured value Vs2 exceeds the voltage threshold Vth, the controller 10 closes the switch S1 (YES in Step S3, and Step S4). When the switch S1 is closed, the offset output block 13 is connected to the subtractor 15 and the offset voltage Voff is subtracted from the target voltage VLO. That is, the target voltage VLO is corrected to the correction target voltage VLOc (=VLO−Voff). As described before, the offset voltage Voff is expressed by Voff=Vs2−Vth.

Subsequently, the controller 10 compares the acquired measured value Vs2 and the voltage upper limit value Vx with each other (Step S6). In a case where the measured value Vs2 exceeds the voltage upper limit value Vx, the controller 10 stops the main circuit 3 (YES in Step S6, and Step S7). Processes in Steps S6 and S7 are executed by the overvoltage monitoring block 17 of the controller 10. If the process in Step S7 (stopping the main circuit 3) is executed, another process for dealing with abnormality occurring in a vehicle is also executed, although not illustrated. The other process includes a process of notifying the high-order controller of a message of the occurrence of abnormality, for example.

In a case where the measured value Vs2 does not exceed the voltage upper limit value Vx (NO in Step S6), the controller 10 ends the process.

Figure 2:
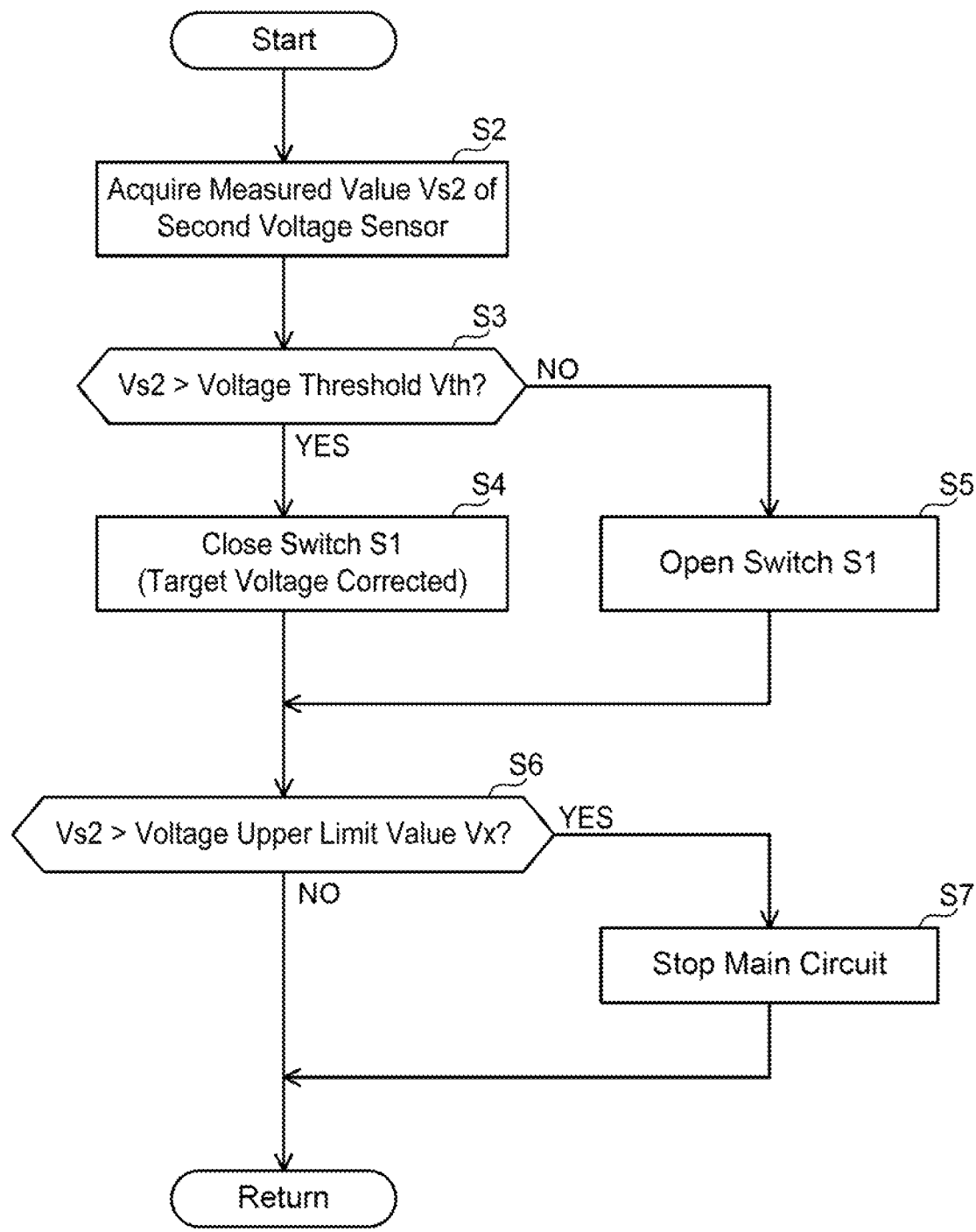
FIG. 2 is a flowchart of a process executed by a controller.

As described before, the feedback control is regularly executed separately from the process in FIG. 2. When the target voltage is corrected by the process in Step S4, a target value of the feedback control is changed from the target voltage VLO to the correction target value VLOc (=VLO−Voff). As a result, the feedback control block 16 controls the main circuit 3 such that the voltage difference between the measured value Vs1 of the first voltage sensor 4 and the correction target voltage VLOc converges to zero. The offset voltage Voff is a value obtained by subtracting the voltage threshold Vth from the measured value Vs2 of the second voltage sensor 5. That is, the correction target voltage VLOc is expressed by VLOc=VLO−Vs2+Vth. In this case, when the voltage difference converges to zero, the output voltage Vout is expressed by Vout=(Vx−|e2|)−e2, as described before. By correcting the target voltage, the false determination by the overvoltage monitoring block 17 caused by accumulation of the errors can be prevented.

Second Embodiment

Figure 3:
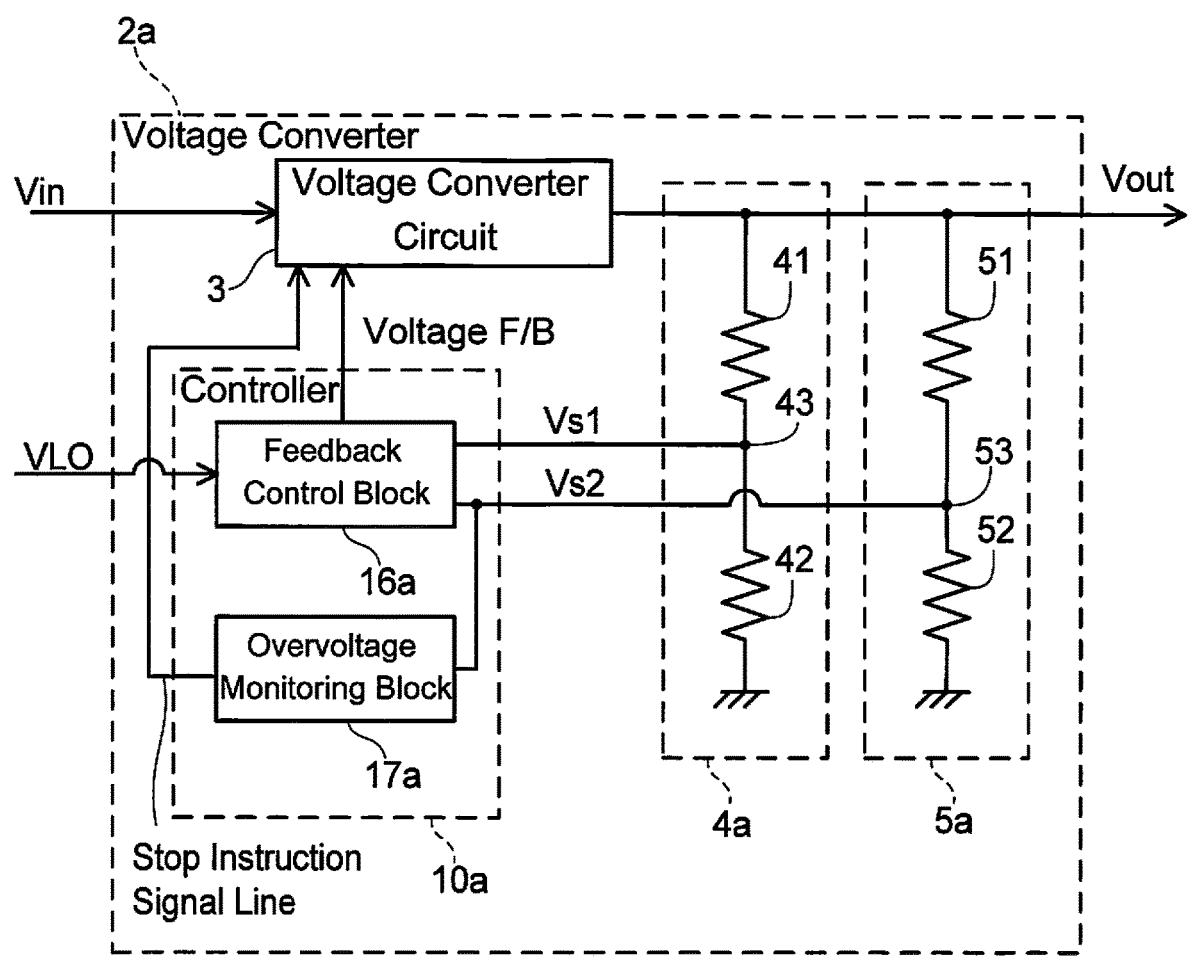
FIG. 3 is a control block diagram of a voltage converter of a second embodiment.

A voltage converter 2a of a second embodiment will be described referring to FIG. 3. FIG. 3 is a block diagram of the voltage converter 2a of the second embodiment. The voltage converter 2a includes the main circuit 3, a controller 10a, a first voltage sensor 4a, and a second voltage sensor 5a. Functions of the voltage converter 2a of the second embodiment are the same as the functions of the voltage converter 2 of the first embodiment.

The main circuit 3 has the same configuration as the main circuit of the voltage converter 2 of the first embodiment, and transforms a voltage inputted thereto (the input voltage Vin) with a predetermined ratio and outputs the transformed voltage. The output voltage Vout of the main circuit 3 is measured by the first voltage sensor 4a and the second voltage sensor 5a. The first voltage sensor 4a is constituted of two resistors 41 and 42. The two resistors 41 and 42 are connected in series between an output line of the main circuit 3 and a ground. A midpoint 43 in the series connection of the two resistors 41 and 42 corresponds to an output end of the first voltage sensor 4a. That is, the first voltage sensor 4a divides the output voltage Vout of the main circuit 3 with a predetermined voltage ratio, and outputs the divided voltage. An output of the first voltage sensor 4a (the measured value Vs1 of the first voltage sensor 4a) is inputted to the controller 10a.

The second voltage sensor 5a includes the same configuration as the first voltage sensor 4a, and is constituted of two resistors 51 and 52. The two resistors 51 and 52 are connected in series between the output line of the main circuit 3 and the ground. A midpoint 53 in the series connection of the two resistors 51 and 52 corresponds to an output end of the second voltage sensor 5a. The second voltage sensor 5a divides the output voltage Vout of the main circuit 3 with a predetermined voltage ratio and outputs the divided voltage. An output of the second voltage sensor 5a (the measured value Vs2 of the second voltage sensor 5a) is also inputted to the controller 10a. To the controller 10a, the target voltage VLO is inputted from a high-order controller (not illustrated).

The controller 10a is constituted of a feedback control block 16a and an overvoltage monitoring block 17a. The feedback control block 16a includes a CPU (central processing unit) and a memory, and a program stored in the memory is executed by the CPU. In a case where the measured value Vs2 of the second voltage sensor 5a is less than the voltage threshold Vth, the feedback control block 16a executes a feedback control for the main circuit 3 such that the measured value Vs1 of the first voltage sensor 4a becomes coincident with the target voltage VLO.

In a case where the measured value Vs2 of the second voltage sensor 5a exceeds the voltage threshold Vth, the feedback control block 16a corrects the target voltage VLO. Specifically, the feedback control block 16a sets a value obtained by subtracting the offset voltage Voff from the target voltage VLO as the correction target voltage VLOc. The feedback control block 16a executes the feedback control for the main circuit 3 such that the measured value Vs1 of the first voltage sensor 4a becomes coincident with the correction target voltage VLOc. The offset voltage Voff is set to a value obtained by subtracting the voltage threshold Vth from the measured value Vs2 of the second voltage sensor 5a.

When the measured value Vs2 of the second voltage sensor 5a exceeds the voltage upper limit value Vx, the overvoltage monitoring block 17a stops the main circuit 3. The overvoltage monitoring block 17a is completely achieved by hardware, not by a CPU nor a program. The overvoltage monitoring block 17a is constituted of a comparator and an amplifier, for example.

The voltage converter 2a of the second embodiment operates in the same manner as the voltage converter 2 of the first embodiment. The voltage converter 2a has a high processing speed because the overvoltage monitoring block 17a is constituted of hardware. The first voltage sensor 4a and the second voltage sensor 5a of the voltage converter 2a are each constituted of the two resistors. Configurations of the first voltage sensor 4a and the second voltage sensor 5a are simple and therefore can be achieved at a low cost.

Some of the features of the technique described in the embodiments will be described. In a case where the measured value Vs2 of the second voltage sensor 5 (5a) is less than the voltage threshold Vth, the controller 10 (10a) of the voltage converter 2 (2a) of the embodiments executes the feedback control such that the measured value Vs1 of the first voltage sensor 4 (4a) becomes coincident with the target voltage VLO. Due to the feedback control, the output voltage Vout follows the target voltage VLO in a range of the tolerance |e1| of the first voltage sensor 4. The voltage threshold Vth is set to a value less than the voltage upper limit value Vx. Specifically, the voltage threshold Vth is set to a value less than the voltage upper limit value Vx by the measurement tolerance e2| of the second voltage sensor 5 (5a) (Vth=Vx-|e2|). The tolerance |e1| of the first voltage sensor 4 (4a) and the tolerance |e2| of the second voltage sensor (5a) are approximately equal to each other. Therefore, while the measured value Vs2 of the second voltage sensor 5 (5a) is less than the voltage threshold Vth, the measured value Vs2 of the second voltage sensor 5 (5a) does not exceed the voltage upper limit value Vx.

In a case where the measured value Vs2 of the second voltage sensor 5 (5a) exceeds the voltage threshold Vth, the controller 10 (10a) corrects the target voltage VLO to the correction target voltage VLOc (=VLO−Voff) which is less than the target voltage VLO. Since the target voltage is lowered, the actual output voltage Vout is also lowered. As a result, the measured value Vs2 that has the error of the second voltage sensor 5 (5a) is also lowered. Therefore, the measured value Vs2 of the second voltage sensor 5 (5a) is prevented from exceeding the voltage upper limit value because of the error.

The offset voltage Voff is set to a value obtained by subtracting the voltage threshold Vth from the measured value Vs2 (Voff=Vs2−Vth). That is, the correction target voltage is expressed by VLOc=VLO−Voff=VLO−(Vs2−Vx). In this case, the output voltage Vout is expressed by Vout=(Vx−|e2|)−e2, as shown in Equation 1. Even when the measured value Vs2 of the second voltage sensor 5 (5a) has the tolerance |e2|, the measured value Vs2 of the second voltage sensor 5 (5a) does not exceed the voltage upper limit value Vx.

Some of the features of the technique described in the embodiments will be described. Processes executed by the overvoltage monitoring block 17 (17a) (the processes in Steps S3 and S4 in FIG. 2) correspond to an example of error process. As the error process executed when the measured value Vs2 of the second voltage sensor 5 (5a) exceeds the voltage upper limit value Vx, an output of the main circuit 3 may be limited.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A voltage converter comprising;
   a voltage converter circuit;
   a first voltage sensor and a second voltage sensor both configured to measure an output voltage of the voltage converter circuit; and
   a controller configured to execute a feedback control for the voltage converter circuit such that a voltage difference between a target voltage and a measured value of the first voltage sensor becomes zero and configured to execute a predetermined error process in a case where a measured value of the second voltage sensor exceeds a predetermined voltage upper limit value, wherein
   the controller executes the feedback control for the voltage converter circuit such that a voltage difference between a correction target voltage and the measured value of the first voltage sensor becomes zero while the measured value of the second voltage sensor exceeds a voltage threshold which is less than the voltage upper limit value, the correction target voltage obtained by subtracting an offset voltage from the target voltage.

2. The voltage converter as in claim 1, wherein
   the offset voltage is a value obtained by subtracting the voltage threshold from the measured value of the second voltage sensor.

3. The voltage converter as in claim 1, wherein
   the voltage threshold is a value obtained by subtracting a tolerance of the second voltage sensor from the voltage upper limit value.

4. The voltage converter as in claim 1, wherein
   the predetermined error process is a process of stopping the voltage converter circuit.

* * * * *